United States Patent [19]

Shelnut et al.

[11] 4,350,753
[45] Sep. 21, 1982

[54] POSITIVE ACTING COMPOSITION YIELDING PRE-DEVELOPMENT HIGH VISIBILITY IMAGE AFTER RADIATION EXPOSURE COMPRISING RADIATION SENSITIVE DIAZO OXIDE AND HALOALKYL-S-TRIAZINE WITH NOVOLAK AND DYESTUFF

[75] Inventors: James Shelnut, Carmel; Eugene Golda, Monsey; Alan Wilkes, Brewster; Ken-ichi Shimazu, Briarcliff Manor, all of N.Y.

[73] Assignee: Polychrome Corporation, New York, N.Y.

[21] Appl. No.: 273,790

[22] Filed: Jun. 15, 1981

[51] Int. Cl.$^3$ .................... G03C 1/54; G03C 1/60; G03F 7/08
[52] U.S. Cl. .................... 430/190; 430/191; 430/192; 430/292; 430/326; 430/338; 430/339; 430/165
[58] Field of Search ............ 430/326, 270, 191, 192, 430/190, 165, 292, 281, 339, 338

[56] References Cited

U.S. PATENT DOCUMENTS

| | | | |
|---|---|---|---|
| 3,954,475 | 5/1976 | Bonham et al. | 430/916 |
| 3,969,118 | 7/1976 | Stahlhofen et al. | 430/191 |
| 4,160,671 | 7/1979 | Stahlhofen | 430/191 |
| 4,173,470 | 11/1979 | Fahrenholtz et al. | 430/165 |
| 4,189,323 | 2/1980 | Buhr | 430/281 |

*Primary Examiner*—Charles L. Bowers, Jr.

[57] ABSTRACT

A colored, positive-acting, radiation-sensitive composition whose color is extinguished or greatly decreased in intensity upon irradiation comprising at least one acid-free resin, at least one component which upon irradiation yields acidic and/or free radical products, at least one acid and/or free radical sensitive dyestuff and at least one positive-acting component; positive-acting elements comprising suitable support materials at least one surface of which has been coated with the above composition and lithographic printing plates comprising the above elements, wherein the support materials are lithographically suitable support materials, whch have been imagewise exposed to radiation whereby there is a high contrast, before development, between the colored image areas and less intensely colored or colorless non-image areas, the image areas of said plates being additionally highly stable against aqueous alkaline developers after development to remove the exposed non-image areas of the composition and more highly colored than the non-image areas of the revealed substrate surface.

13 Claims, No Drawings

POSITIVE ACTING COMPOSITION YIELDING PRE-DEVELOPMENT HIGH VISIBILITY IMAGE AFTER RADIATION EXPOSURE COMPRISING RADIATION SENSITIVE DIAZO OXIDE AND HALOALKYL-S-TRIAZINE WITH NOVOLAK AND DYESTUFF

BACKGROUND OF THE INVENTION

This invention relates to lithographic plates. More particularly, it relates to a colored, positive-acting, radiation-sensitive composition, useful in the preparation of lithographic printing plates, whose color is extinguished or greatly reduced in intensity upon exposure to radiation thereby providing great contrast between image and non-image areas on said plates prior to development, comprising at least one acid-free resin, at least one component which upon irradiation yields acidic and/or free radical products, at least one acid and/or free radical sensitive dyestuff and at least one positive-acting component. It also relates to a positive action, radiation-sensitive element comprising a support material at least one surface of which has been coated with the above composition. It also relates to a lithographic printing plate of high contrast between the deeply colored image, and the less intensely colored or colorless non-image areas, before development, prepared from said element, wherein the support material is lithographically suitable, by imagewise exposure. Said image areas, furthermore, are highly stable to moisture and alkali developers and more highly colored than the revealed substrate surface after development.

Depending upon the nature of the radiation-sensitive coating employed a lithographic printing plate may reproduce the image to which it is exposed, in which case it is termed a positive-acting plate, or produce an image complementary to the one to which it is exposed in which case it is termed a negative-acting plate.

A positive-working printing plate is then, generally, one in which the non-image area is the portion of the radiation-sensitive composition exposed to radiation and thereby rendered more developer soluble than the unexposed portions which are inherently, or are chemically hardened and rendered, oleophilic and, therefore, ink receptive.

It is highly desirable, in the art of preparing positive-working lithographic printing plates, to prepare an image which is easily visible to the plate maker immediately after exposure to radiation, but before development, so that the skilled worker can seen and compose the letters, numbers, and symbols on the plate after each exposure and make such alterations and modifications as may be necessary. This would not be possible if the image were not visible immediately after exposure. Such visibility depends upon differences in the intensities and/or colors of room light reflected from the exposed and unexposed areas of the plate. It is well known in the art to obtain such differentials in positive-working plates where the exposed, or non-image, areas of the plate become darker upon irradiation resulting in a greater image visibility as compared to the unexposed, image areas which retain the original color of the composition as prepared by the manufacturer. However, in general, those differentials are not the most desirable since the background or non-image areas are in effect more intense in color than the unexposed areas which will form the actual image to be printed. It is, therefore, more desirable to obtain a visibility differential between the background and the image wherein the characteristics are reversed; that is, where the image is rendered more intense in color than the exposed non-image areas. This has the additional advantage of providing for great contrast between the image and non-image areas of the subsequently developed plate.

One attempt at producing a positive-working lithographic printing plate, wherein the exposed, non-image areas are rendered lighter than the unexposed, originally colored image areas, thereby creating the desired difference in visibility, is described in U.S. Pat. No. 3,969,118. According to that method, a positive-working, radiation-sensitive ester of naphthoquinone-(1,2-)-diazide-(2)-5-sulfonic acid is blended with an organic dyestuff and a halide of naphthoquinone-(1,2)-diazide-(2)-4-sulfonic acid.

However, such a system suffers from inter alia, being very sensitive to moisture and alkalies, e.g., developers. Thus, while the color differential between the image and non-image areas rises as the concentration of the sulfonyl halide increases, the hardness of the printing surface decreases and it is more easily attacked by the alkaline developers. The resultant plate, consequently, yields fewer prints than a lower contrast plate.

If, however, the sulfonyl chloride is eliminated it is found that the composition, throughout the coating, is partially decolorized prior to exposure thereby yielding a product of decreased contrast between the exposed and unexposed areas thereof. It is believed that this result is due to the presence of acid in the resin components of the composition which has remained from the process of preparing said resins.

In the continuation application of J. Shelnut and R. Cohen, Ser. No. 273,819, filed even date herewith, there is described a composition which overcomes the above disadvantages by replacing the resins used in the compositions of the prior art by resins which are inherently, or are rendered, free of acids. The above application is incorporated herewith by reference.

In U.S. Pat. No. 4,189,323, Buhr describes a positive-acting composition comprising a haloalkylated-s-triazine which changes color in the presence of acidic products produced upon irradiation of said triazine. The composition is further comprised of a cresol-formaldehyde novolak, an acid sensitive dyestuff and an aqueous solution insoluble polymer which is cleaved and thereby rendered soluble in said solution, by the above acidic products.

It has now been found that the use of the composition according to the instant invention in the preparation of the lithographic printing plates, results in exposed but undeveloped plates of much more intense color contrasts than heretofore available.

SUMMARY OF THE INVENTION

It is an object of this invention to provide a colored, stable, radiation-sensitive, positive-acting composition which upon imagewise exposure to radiation is rendered colorless or much less intensely colored in the non-image areas.

It is another object of this invention to provide a colored, stable, radiation-sensitive, positive-acting element which upon imagewise exposure to radiation is rendered colorless or much less intensely colored in the non-image areas.

It is yet another object of this invention to provide positive-working lithographic printing plates of high contrast between the image and non-image areas before development and of high stability to moisture and alkalies and high contrast between image or non-image areas after development.

These and other objects of the invention will be in part discussed and in part apparent upon a consideration of the detailed description of the preferred embodiment.

DETAILED DESCRIPTION OF THE INVENTION

In accordance with the invention it has now been unexpectedly found that a colored, positive-acting, radiation-sensitive composition useful in preparing objects of great contrast between the exposed and unexposed areas thereof may be prepared by admixing an acid-free resin, a component which upon irradiation yields acidic and/or free radical products, a dyestuff which upon contact with an acid and/or free radical becomes colorless or much less intensely colored than in its basic form and a positive-acting component.

Thus, in accordance with the invention there is provided a colored, positive-acting composition whose color disappears or decreases upon irradiation comprising an admixture of, I. at least one acid-free, aqueous alkali-sensitive resin;
II. at least one radiation-sensitive component which upon irradiation yield acidic and/or free radical products;
III. at least one acid and/or free radical sensitive dyestuff which upon contact with the product of irradiation of component II is rendered colorless or much less intensely colored than before such contact; and
IV. at least one positive-acting component, said composition becoming colorless or less intensely colored, after irradiation than before.

Illustrative of aqueous alkali-sensitive resins which may be used in accordance with the invention are maleic anhydride copolymers with styrene or vinyl alkyl ethers, and the like, and low molecular weight condensation products of (mono- or poly- hydroxy) aryl compounds with aldehydes and ketones, e.g., the so called "novolaks". Preferred resins according to the invention are the novolaks.

However, as indicated above, "novolaks", as commercially prepared, contain free acid which decreases the contrast between exposed (non-image areas) and unexposed (image) areas of an element coated with the composition according to the invention. A similar decrease in contrast is observed in the printing plate, formed upon development of said exposed element, between the dark (unexposed) image areas thereof and the revealed substrate. Thus, according to the invention the novolak must be treated to make it acid free.

In the preparation of such an acid-free novolak any commercial novolak (e.g., Alnoval TM PN 430, manufactured by Hoechst) is treated with an excess of base, rinsed and dried.

The bases useful in preparing the acid-free novolaks are known in the art and include organic and heterocyclic tertiary amines, such as, trialkylamines, e.g., triethylamine; tertiary alkyl arylamines, such as, dimethylaniline; heterocyclic amines such as, pyridines, and the like, wherein all of the foregoing may be unsubstituted or substituted with non-reactive substitutents, and mixtures thereof. In the practice of this invention preferred base is triethylamine.

The preparation of such base treated novolaks is discussed in greater detail in the aforementioned application of Shelnut and Cohen.

The radiation-sensitive components useful in accordance with the invention, which upon irradiation yield acidic and/or free radical products are known in the art and include the haloalkylated-s-triazines such as are described in U.S. Pat. Nos. 3,954,475, issued May 4, 1976; 4,189,323, issued Feb. 19, 1980 and 4,239,850, issued on Dec. 16, 1980. A preferred haloalkylated-s-triazines is selected from the group consisting of 2-(p-methoxyphenyl)-4,6-bis(trichloromethyl)-s-triazine and 2-(4-methoxynaphth-1-yl)-4,6-bis(trichloromethyl)-s-triazine.

The dyestuff (III) may be selected from those known in the art which upon exposure to acidic and/or free radical substances become either colorless or much lighter than their basic and/or reduced forms such as, basic dyes, phthaleins, leuco dyes and the like and mixtures thereof. In general, the acid-sensitive dyestuff is selected from the group consisting of azo, azine, anthraquinone and triphenylmethyl dyes.

The above dyestuffs may be exemplified by Calco TM Oil Blue RA (American Cyanamid Corp.), malachite green, naphthol yellow, Brilliant green, Bromcresol green, 4-Nitrophenol, Bromcresol purple, Crystal violet, Alizarin red S, Quinaldine red, Alizarin red S, Methyl green, Chlorophenol red, Eosin Y, Nitazine yellow, Methyl violet, Bromothymol blue, m-Cresol purple, Brilliant yellow, Thymol blue, Rosolic acid, Xylenol blue, Phenol red, Eosin B, 3-Nitrophenol, Cresol Red, Orange II, Phloxine B, Phenolphthalein, Bromophenol Blue, o-Cresolphenolphthalein, Bromochlorophenol Blue, Thymolphthalein, and the like and mixtures thereof. A preferred acid-sensitive dyestuff is Bromophenol Blue.

The positive-acting radiation-sensitive components useable in connection with the instant invention are those known to the art including diazo oxides such as, aromatic or heterocyclic esters or amides of naphthoquinone-diazide sulfonic or carboxylic acids, for instance those that are described, e.g., by Kosar ("*Light Sensitive Systems*", John Wiley & Sons, N.Y., 1965), in U.S. Pat. No. 3,785,285 and in Canadian Pat. No. 602,980. A preferred diazo oxide is the ester of 1,2-naphthoquinone-2-diazide-5-sulfonic acid with the product prepared by the condensation of pyrogallol with acetone.

Another type of positive-acting components which are useable in accordance with this invention are those polymers which are essentially insensitive to water or aqueous alkali but are rendered soluble or dispersible in such solution upon contact with the free radicals and/or acidic products generated upon irradiation of the composition according to the invention.

Such polymers are known in the art and include polymers containing at least one ortho-carboxylic acid ester- and/or carboxylic acid amide-acetal grouping; the compounds may have a polymeric character and the groupings may be present as connecting elements in the main chain or as lateral substituents, and the like, such as are described, e.g., in Ger. Offen. No. 2,610,842; polymeric compounds containing recurrent acetal and/or ketal groupings in which both carbon atoms in the α-position of the alcohols required for forming the groupings are aliphatic, and aryl-alkyl-acetals and-aminals such as are described in, e.g., Ger. Ausleg. No. 2,306,248.

The composition according to the invention comprises about 24 to about 75% wt. acid-free resin, about 0.5 to about 10% wt. of component II, about 0.2 to about 10% wt. of component III and about 24 to about 75% of the positive-acting component IV, all of the percentages being based on the total weight of the composition.

Preferably the composition comprises about 50 to about 75% wt. resin, about 1 to about 3% wt. component II, about 2 to about 4% wt. component III and about 25 to about 50% wt. of component IV.

Additionally the composition may comprise additives selected from the group consisting of other acid-free and alkali-insensitive resins and other colorants, photosensitizers and the like and mixtures thereof.

The other resins may be exemplified by polyurethanes, epoxy resins, acrylics, and the like and mixtures thereof.

Illustrative of the other colorants useful in accordance with the invention are Victoria Blue and other dyes which are not acid- or base-sensitive, and the like and mixtures thereof.

The instant invention also provides a radiation-sensitive element comprising a base support having coated on at least one surface thereof any of the radiation-sensitive compositions according to the invention.

The support may be chosen from any art known support materials dependent upon the intended use of the element, including Al and its alloys, metal coated paper and plastic foils, and the like. For production of lithographic printing plates the support preferably comprises Al or its lithographically suitable alloy.

The composition may be applied to the support from a solution by any means known in the art including whirl coating, meniscus coating, and the like, the solvent therefor being selected from the group comprising ketones, such as, acetone and methyl ethyl ketone; amides such as N,N-dimethylformamide and N,N-dimethylacetamide; esters such as n-amyl acetate; polyethers and their esters such as, methyl Cellosolve TM and methyl Cellosolve acetate, and the like and mixtures thereof. A preferred solvent is a mixture comprising about 30% methyl isobutyl ketone (MIBK), about 30% n-amyl acetate (NAA) about 20% methyl ethyl ketone (MEK) and about 20% ethyl Cellosolve TM (EC) (all percentages being by volume and based upon the total solvent volume).

There is also provided, according to the instant invention, a method for the preparation of a lithographic plate, showing high contrast between the image and non-image areas which comprises imagewise exposing any of the above radiation-sensitive elements according to the invention, to radiation whereby the non-image (exposed) areas are rendered colorless or less intensely colored than the non-exposed image areas, making desired corrections and after final imagewise exposure developing the plate to remove all non-image areas of the composition.

If desired, the developed plate may be post-treated to increase the oleophilicity, and thereby, the ink receptivity of the image areas of the developed plate. The post-treatments may be accomplished chemically or thermally to harden the non-irradiated areas, by means known to the art.

The following examples illustrate but are not meant to restrict the scope of the invention as claimed.

EXAMPLE 1

A. Preparation of acid-free novolak 200 gm. triethylamine was added to 100 gm. novolak resin (e.g., ALNOVAL TM PN 430) which had been dissolved in 500 ml 2-propanol.

The resultant mixture was then added to an aqueous solution comprising 1% wt. NaCl. The precipitated product was removed by filtration, washed, dried and ground.

B. Radiation-sensitive composition

A radiation-sensitive, positive-working, acid-sensitive composition was prepared by blending,

| | |
|---|---|
| Resin from Step A | 6.35 gm. |
| Product of the reaction of 1,2-naphtho-quinone-2-diazide-5-sulfonic acid with the product of the condensation of acetone and pyrogallol | 3.30 gm. |
| 2-(p-Methoxyphenyl)-4,6-bis(trichloromethyl)-s-triazine | 0.40 gm. |
| Bromocresol green, Na$^+$ salt | 0.06 gm. |
| Calco Oil Blue RA | 0.06 gm. |
| and Bromophenol Blue | 0.25 gm. |

C. Radiation-sensitive element

The composition of step B was dissolved in a solvent comprising 32 gms of MEK, 48 gms of MIBK, 48 gms of NAA and 37 gms of ethylene glycol monomethyl ether and the resulting solution used to coat a sheet of aluminum alloy AA1100 which had been mechanically grained and then anodized in an electrolyte comprising 17% wt. aqueous $H_2SO_4$ at 30° C. and 3.2 A/dm$^2$ for one minute.

After evaporation of the solvents the resulting element was imagewise exposed to UV radiation through a positive flat, using a 5KW metal halide radiation source, at a distance of 36 inches for one minute. The resultant plate exhibited an unexpectedly high color contrast between the exposed and unexposed areas thereof.

Reflection densitometer measurements were then made on the above plates and compared with plates prepared according to the prior art. The results are given in Table I.

TABLE I

| Plate No. | Coating | Densitometer Reading | | |
|---|---|---|---|---|
| | | Exposed | Unexposed | Δ |
| 1 | According to Example 1 | 1.21 | 0.5 | 0.71 |
| 2 | According to copending Application SN 273,819* | 1.21 | 0.89 | 0.32 |
| 3 | ** | 0.74 | 0.64 | 0.10 |

*On this plate the coating was the same as in plate 1 except that there was no triazine present.
**On this plate the coating was the same as in plate 1 except that the novolak was not treated with base.

Contrast is measured by the difference, Δ, between the color densities of the exposed and unexposed areas of a plate. Thus, the higher the value of Δ the higher is the contrast on the plate. As can be seen from the table the value of Δ, 0.71, for the composition according to the invention wherein *both* acid-free resin and triazine are used is much greater than might have been expected.

D. Lithographic printing plate

After correction of any errors, which were observed, the plate was developed by treatment with an alkaline developer to remove the exposed non-image areas and yield a lithographic printing plate of high contrast between the image and non-image areas and of great stability against water and/or aqueous alkaline solutions.

The resultant plates were found to produce 100,000 acceptable prints on a Chief ™ printing unit.

EXAMPLE 2

Example 1 was repeated except that the 2-[4-methoxyphenyl]-s-triazine was replaced by the 2-[4-methoxynaphth-1-yl]-s-triazine. Similar results were obtained.

EXAMPLE 3

Example 1 was repeated except that the Bromophenol blue was replaced by 0.09 gms. of Rhodamine 6G and 0.25 gm. of Bromocresol green, Na+ salt were used. Similar results were obtained.

EXAMPLE 4

Example 3 was repeated except that the 2-[4-methoxyphenyl]-s-triazine was replaced by the 2-[4-methoxynaphth-1-yl]-s-triazine. Similar results were obtained.

EXAMPLE 5

Example 3 was repeated except that the reaction product of pyrogallol with acetone was replaced by the reaction product of cresol with formaldehyde. Similar results were obtained.

EXAMPLE 6

Example 3 was repeated except that the novolak was replaced by a cashew nut oil novolak copolymer (e.g., LX ™ 454 of the 3M Corp.) which had been treated with triethylamine. Similar results were obtained.

What is claimed is:

1. A colored, positive-acting composition whose color disappears or decreases upon irradiation comprising an admixture of,
   I. at least one acid-free, aqueous alkali-soluble novolak resin as the major resin in the composition;
   II. at least one haloalkyl-s-triazine radiation-sensitive component which upon irradiation yields acidic products;
   III. at least one acid-sensitive dyestuff which upon contact with the product of irradiation of component II is rendered colorless or much less intensely colored than before such contact; and
   IV. at least one positive-acting diazo oxide which upon irradiation yields acidic products.

2. The composition according to claim 1 further comprising at least one component selected from the group consisting of other acid-free resins, colorants and photosensitizers.

3. The composition according to claim 1 wherein said acid-free novolak resin is a phenol-formaldehyde condensate.

4. The composition according to claim 1 wherein said acid-free novolak resin is a cresol-formaldehyde condensate.

5. The composition according to claim 1 wherein said acid-free novolak resin is a cashew nut oil-formaldehyde condensate.

6. The composition according to claim 1 or 2 wherein said component II comprises at least one compound selected from the group comprising mono-, di- or tri-(mono- or poly- halo-substituted alkyl)-s-triazines.

7. The composition according to claim 6 wherein said triazine is a 2-substituted-4,6-bis(trichloromethyl)-s-triazine wherein the 2-substituent is selected from the group comprising p-methoxyphenyl and 4-methoxynaphth-1-yl.

8. The composition according to claim 7 wherein said 2-substituent is p-methoxyphenyl.

9. The composition according to claim 7 wherein said 2-substituent is 4-methoxynaphth-1-yl.

10. The composition according to claim 1 or 2 wherein said component III is selected from the group of azo, azine, anthraquinone and triphenylmethyl dyes.

11. The composition according to claim 1 wherein said diazo oxide is selected from the group comprising aromatic or heterocyclic esters or amides of naphthoquinone-diazide-sulfonic or carboxylic acids wherein the hydroxy and amine precursors are monomeric or polymeric.

12. The composition according to claim 11 wherein said diazo oxide is the ester of 1,2-naphthoquinone-2-diazide-5-sulfonic acid with the product of the condensation of pyrogallol with acetone.

13. A positive-acting, radiation-sensitive element comprising a suitable support having coated upon at least one surface thereof a composition according to claim 1 or 2.

* * * * *